(12) United States Patent
Tee et al.

(10) Patent No.: US 8,217,518 B2
(45) Date of Patent: Jul. 10, 2012

(54) ENHANCING METAL/LOW-K INTERCONNECT RELIABILITY USING A PROTECTION LAYER

(75) Inventors: Tong Yan Tee, Singapore (SG); Xueren Zhang, Singapore (SG); Shanzhong Wang, Singapore (SG); Valeriy Nosik, Singapore (SG); Jijie Zhou, Singapore (SG); Sridhar Idapalapati, Singapore (SG); Subodh Mhaisalkar, Singapore (SG); Zhi Yuan Shane Loo, Singapore (SG)

(73) Assignees: STMicroelectronics Asia Pacific Pte., Ltd., Singapore (SG); Nanyang Technological University, Singapore (SG)

( * ) Notice: Subject to any disclaimer, the term of this patent is extended or adjusted under 35 U.S.C. 154(b) by 437 days.

(21) Appl. No.: 11/715,261

(22) Filed: Mar. 7, 2007

(65) Prior Publication Data
US 2007/0216032 A1    Sep. 20, 2007

Related U.S. Application Data

(60) Provisional application No. 60/780,119, filed on Mar. 8, 2006, provisional application No. 60/780,094, filed on Mar. 8, 2006.

(51) Int. Cl.
H01L 23/373    (2006.01)

(52) U.S. Cl. .................. 257/759; 257/789; 257/E23.11; 257/E54.01; 977/742; 977/785

(58) Field of Classification Search ................. 257/746, 257/E23.145, E21.589, 701, 706, 720, 758, 257/789, 795, 796, 759, E51.04, E23.121, 257/E23.194, E23.11; 977/723, 778, 781, 977/785, 742
See application file for complete search history.

(56) References Cited

U.S. PATENT DOCUMENTS

| | | | |
|---|---|---|---|
| 6,674,168 B1 * | 1/2004 | Cooney et al. | 257/758 |
| 6,800,886 B2 * | 10/2004 | Awano | 257/276 |
| 6,825,428 B1 * | 11/2004 | Zhang et al. | 200/181 |
| 6,984,579 B2 * | 1/2006 | Nguyen et al. | 438/622 |
| 7,176,119 B2 * | 2/2007 | Gambino et al. | 438/622 |
| 7,233,071 B2 * | 6/2007 | Furukawa et al. | 257/759 |
| 2004/0121571 A1 * | 6/2004 | Uchikoshi et al. | 438/586 |
| 2004/0152240 A1 * | 8/2004 | Dangelo | 438/122 |
| 2009/0142934 A1 * | 6/2009 | Ventzek et al. | 438/778 |

* cited by examiner

Primary Examiner — Jerome Jackson, Jr.
Assistant Examiner — Yu Chen

(57) ABSTRACT

A protection layer is coated or otherwise formed over the interconnect structure. The interconnect structure includes a metal line (such as top and bottom metal layers connected by a metal via) and a low-K material. The protection layer includes a vertically aligned dielectric or other material dispersed with carbon nanotubes. The protection layer could include one or multiple layers of carbon nanotubes, and the carbon nanotubes could have any suitable dispersion, alignment, and pattern in each layer of the protection layer. Among other things, the carbon nanotubes help to reduce or prevent damage to the interconnect structure, such as by reducing or preventing the collapse of the low-K material or delamination between the metal line and the low-K material.

17 Claims, 4 Drawing Sheets

ENHANCING METAL/LOW-K INTERCONNECT RELIABILITY USING A PROTECTION LAYER

CROSS-REFERENCE TO RELATED APPLICATION AND CLAIM OF PRIORITY

The present application is related to U.S. Provisional Patent Application No. 60/780,119, filed Mar. 8, 2006, entitled "INTERCONNECT STRUCTURE, INTEGRATED CIRCUIT, AND METHOD FOR ENHANCING METAL/LOW-K INTERCONNECT RELIABILITY USING A PROTECTION LAYER HAVING CARBON NANOTUBES," and U.S. Provisional Patent Application No. 60/780,094, filed Mar. 8, 2006, entitled "INTERCONNECT STRUCTURE, INTEGRATED CIRCUIT, AND METHOD FOR ENHANCING METAL/LOW-K INTERCONNECT RELIABILITY USING A PROTECTION LAYER".

U.S. Provisional Patent Application No. 60/780,119 and U.S. Provisional Patent Application No. 60/780,094 are assigned to the assignee of the present application and are hereby incorporated by reference into the present disclosure as if fully set forth herein. The present application hereby claims priority under 35 U.S.C. §119(e) to U.S. Provisional Patent Application No. 60/780,119 and U.S. Provisional Patent Application No. 60/780,094.

TECHNICAL FIELD

This disclosure is generally directed to integrated circuits and more specifically to an interconnect structure, integrated circuit, and method for enhancing metal/low-K interconnect reliability using a protection layer. In particular, the protection layer could include carbon nanotubes.

BACKGROUND

Conventional interconnect structures for integrated circuits are often formed using aluminum as a metallization and silicon dioxide as a dielectric. However, while integrated circuits are being continuously scaled down (such as device scaling from the 90 nm node to the 65 nm node and further to the 45 nm node), conventional interconnect structures often suffer from an interconnection delay due to high electrical resistance and parasitic wiring capacitance. These problems are major factors that limit the speed of high performance integrated circuits.

Because of these problems, integrated circuit manufacturers have begun using copper in place of aluminum and a low-K material in place of silicon dioxide in the interconnect structures. The copper helps to lower the resistance of the interconnect metallization and increase the reliability of the interconnect structures, while the low-K material helps to reduce the parasitic capacitance between the interconnect structures by providing a lower dielectric constant.

A problem with these types of interconnect structures is that low-K materials are often mechanically weak, but the interconnect structures often experience high strain or stress when the integrated circuits undergo further processing. For example, the interconnect structures may experience compressive force during a wire bonding process or after epoxy encapsulation, or the interconnect structures may experience shear stress after a flip chip attach. These strains or stresses could cause damage or destruction of the interconnect structures, such as by causing the low-K material to collapse or by causing interfacial delamination of the copper and the low-K material.

SUMMARY

This disclosure provides enhanced metal/low-K interconnect reliability using a protection layer. The protection layer may include carbon nanotubes.

In one embodiment, the present disclosure provides an interconnect structure. The interconnect structure includes a layer of low-K dielectric material and a metal line disposed on the low-K dielectric material. The interconnect structure also includes a layer of silicon nitride disposed on the metal line. The interconnect structure further includes a protection layer having a dielectric material and disposed on the layer of silicon nitride. In some embodiments, the protection layer includes carbon nanotubes.

In another embodiment, the present disclosure provides a method of forming an interconnect structure. The method includes providing a low-K dielectric material on a substrate and disposing a metal line on the low-K dielectric material. The method also includes disposing a silicon nitride layer on the low-K dielectric material. The method further includes disposing a protection layer having dielectric material on the silicon nitride layer.

In still another embodiment, the present disclosure provides an interconnect structure for use in an integrated circuit. The interconnect structure includes a layer of low-K dielectric material and a metal line disposed on the low-K dielectric material. The interconnect structure also includes a layer of silicon nitride disposed on the metal line. The interconnect structure further includes a protection layer having dielectric material and carbon nanotubes (CNTs). The protection layer is disposed on the layer of silicon nitride.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawing, in which.

DETAILED DESCRIPTION

Figure 1:
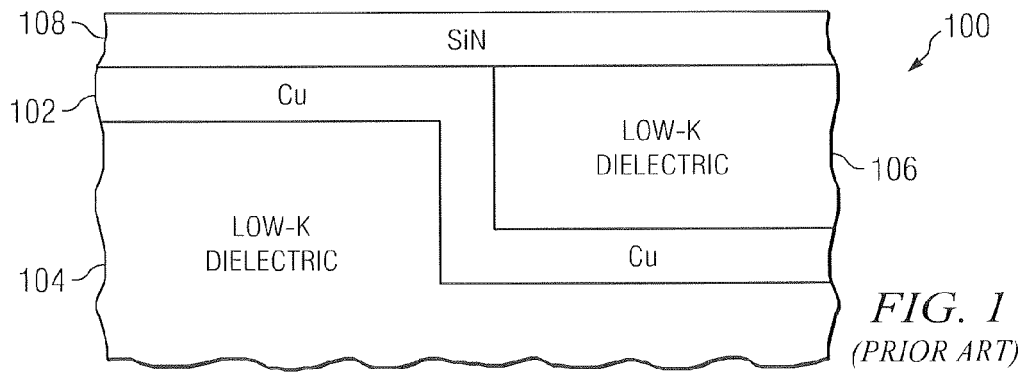
FIG. 1 illustrates a conventional interconnect structure.

FIG. 1 illustrates a conventional interconnect structure 100. In this example, the conventional interconnect structure 100 includes a metal line 102, which in this embodiment includes a top layer and a bottom layer of copper connected by a copper via. One or more low-K materials 104-106 are disposed around the metal line 102. The one or more low-K materials 104-106 could include any suitable number or type of dielectric or other material, including one or more silicon oxycarbides, organic polymers, fluorosilicate glass, or black diamond. A silicon nitride layer 108 is disposed over the metal line 102 and the low-K material 106.

Damage to the conventional interconnect structure 100 may be caused by compressive forces, shear stresses, or other strains or stresses. The damage could include collapse of the low-K materials 104-106 or interfacial delamination between the metal line 102 and either or both of the low-K materials 104-106. Interfacial delamination may be caused by weak adhesion strength at the metal/low-K material interface.

Figure 2A:
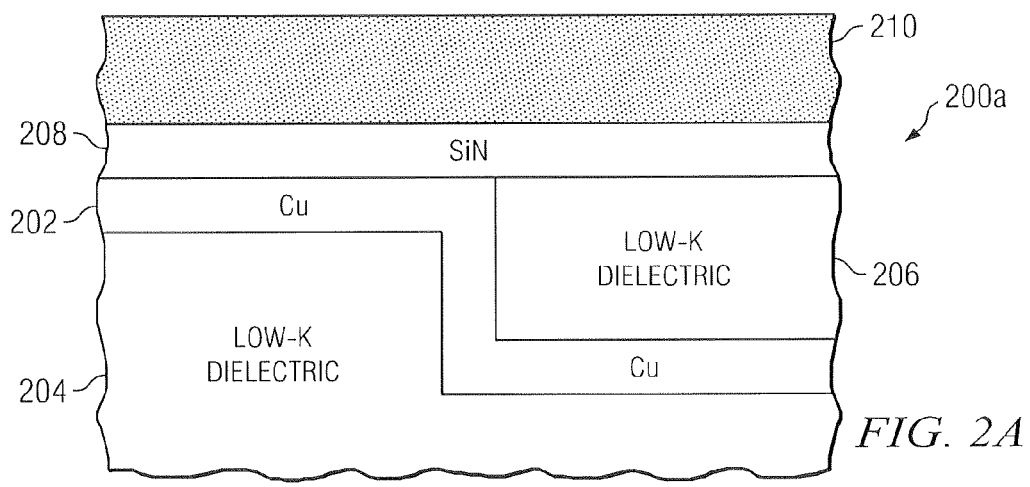
FIG. 2A illustrates an example interconnect structure having a protection layer according to one embodiment of the present disclosure.

FIG. 2A illustrates an example interconnect structure 200a according to one embodiment of this disclosure. The embodiment of the interconnect structure 200a shown in FIG. 2A is for illustration only. Other embodiments of the interconnect structure 200a could be used without departing from the scope of this disclosure.

In this example, the interconnect structure 200a includes a metal line 202, such as a copper line having top and bottom copper layers connected by a copper via. The interconnect structure 200a also includes one or more low-K materials 204-206, such as silicon oxycarbides, organic polymers, fluorosilicate glass, or black diamond. A silicon nitride layer 208 is disposed over the metal line 202 and the low-K material 206.

Figure 4:
FIG. 4 illustrates an example protection layer formed from carbon nanotubes according to one embodiment of the present disclosure.

Although shown as including a single copper metal line 202 with two metal layers, the interconnect structure 200a could include any number of lines 202, and each line 202 could be formed from any conductive material(s) and have any suitable number of layers. In addition, a protection layer 210 is disposed over the silicon nitride layer 208. The protection layer 210 could include one or more dielectric materials. The protection layer 210 could include any suitable number of layers. One example multi-layer protection layer 210 is shown in FIG. 4, which includes four layers 402-408.

Figure 2B:
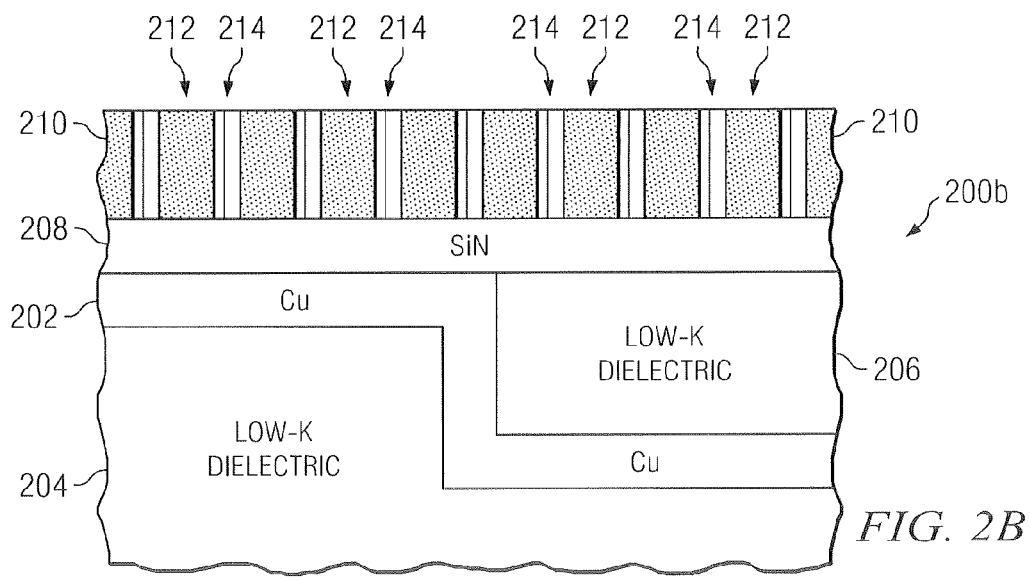
FIG. 2B illustrates an example interconnect structure having a protection layer formed from carbon nanotubes according to one embodiment of the present disclosure.

FIG. 2B illustrates an example interconnect structure 200b according to one embodiment of this disclosure. The embodiment of the interconnect structure 200 shown in FIG. 2B is for illustration only. Other embodiments of the interconnect structure 200b could be used without departing from the scope of this disclosure.

In this example, the interconnect structure 200b includes a metal line 202, such as a copper line having top and bottom copper layers connected by a copper via. The interconnect structure 200b also includes one or more low-K materials 204-206, such as silicon oxycarbides, organic polymers, fluorosilicate glass, or black diamond. A silicon nitride layer 208 is disposed over the metal line 202 and the low-K material 206. Although shown as including a single copper metal line 202 with two metal layers, the interconnect structure 200 could include any number of lines 202, and each line 202 could be formed from any conductive material(s) and have any suitable number of layers. In addition, a protection layer 210 is disposed over the silicon nitride layer 208. The protection layer 210 includes carbon nanotubes (CNTs) dispersed in one or more dielectric materials.

Carbon nanotubes (CNTs) may represent cylindrical carbon molecules with novel properties that make them potentially useful in a wide variety of applications (such as nanoelectronics, optics, and materials applications). Carbon nanotubes (CNTs) often exhibit extraordinary strength and unique electrical properties and are often efficient conductors of heat. For example, carbon nanotubes (CNTs) may have a high Young's modulus (1 TPa) and high tensile strength (100 GPa).

Figure 3:
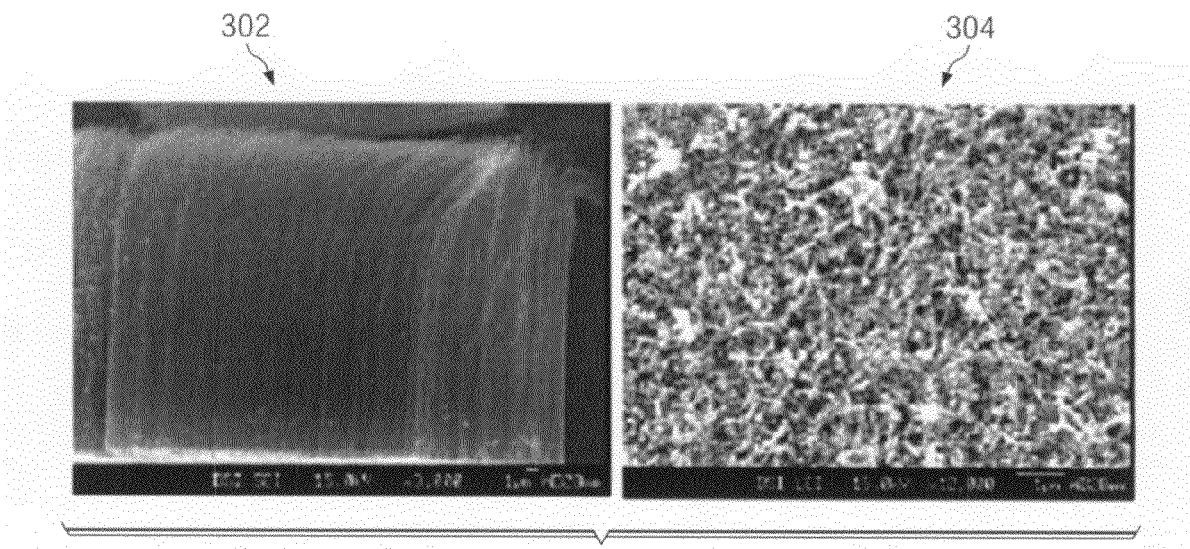
FIG. 3 illustrates carbon nanotubes having different alignments according to one embodiment of the present disclosure.

FIG. 3 illustrates scanning electron microscope images of example carbon nanotubes (CNTs). In particular, image 302 in FIG. 3 illustrates vertically aligned carbon nanotubes (CNTs), while image 304 in FIG. 3 illustrates non-aligned carbon nanotubes (CNTs).

Referring to FIG. 2B, the vertically aligned carbon nanotubes (CNTs) 214 may have any suitable pattern in the protection layer 210. For example, in some embodiments, the vertically aligned carbon nanotubes (CNTs) 214 are arranged in a honeycomb pattern in the protection layer 210. In the illustrated embodiment, the carbon nanotubes (CNTs) 214 are used to improve the mechanical properties of the interconnect structure 200b. As an example, the carbon nanotubes (CNTs) 214 could be positioned to act as cushions or nanosprings, where their high modulus and stiffness are able to absorb impact, shear stresses, or other strains or stresses caused to the interconnect structure 200b.

Among other things, the use of the protection layer 210 may help to address concerns regarding the adhesion and mechanical reliability of metal/low-K interconnect structures, such as the interconnect structure 200a or interconnect structure 200b of FIGS. 2A and 2B (sometimes collectively referred to herein as the interconnect structure 200).

Figure 5:
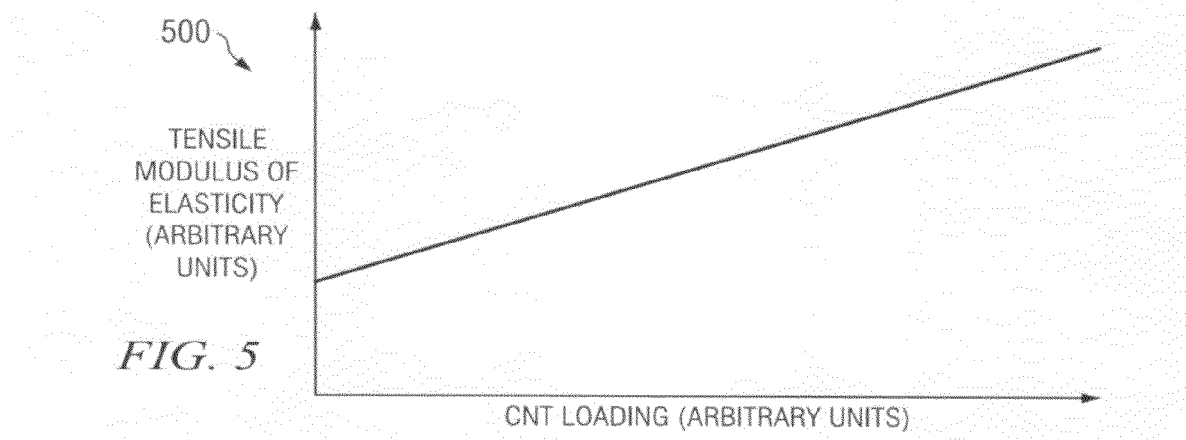
FIG. 5 illustrates an example relationship between tensile modulus of elasticity of a protection layer as a function of carbon nanotube loading according to one embodiment of the present disclosure.

For example, the protection layer 210 may help to shield the interconnect structure 200 from compressive forces that are imposed onto the interconnect structure 200. The protection layer 210 may also help to reduce accumulated strain or stress at the interfaces between the metal line 202 and the low-K materials 204-206. This allows the protection layer 210 to reduce or eliminate collapse of the low-K materials 204-206 and interfacial delamination of the metal line 202 and either or both of the low-K materials 204-206. Also, the high Young's modulus of the carbon nanotubes (CNTs) 214 may help to strengthen the protection layer 210 and pin the top interface, reducing strain of the metal/low-K material interface. In particular embodiments, as shown in FIG. 5, the amount of carbon nanotubes (CNTs) 214 present in the protection layer 210 for the interconnect structure 200b has an impact on the protection layer's tensile modulus of elasticity.

The interconnect structure 200 shown in FIGS. 2A and 2B could be incorporated into or used in any suitable integrated circuit. Also, an integrated circuit could include any number of interconnect structures 200. In addition, the interconnect structure 200 could be used for any suitable purpose in an integrated circuit.

Various techniques could be used to fabricate the interconnect structure 200 of FIGS. 2A and 2B. For example, a catalyst could be deposited on the silicon nitride layer 208, and carbon nanotubes (CNTs) 214 could be grown on the silicon nitride layer 208. In particular embodiments, the carbon nanotubes (CNTs) 214 have a spacing of 100 nm or less. After that, one or more dielectric materials 212 may be deposited in the spaces between the carbon nanotubes (CNTs) 214 to form the protection layer 210. Any other suitable technique could be used to form the interconnect structure 200 of FIGS. 2A and 2B.

Although FIGS. 2A and 2B illustrate examples of an interconnect structure 200, various changes may be made to FIGS. 2A and 2B. For example, materials other than copper and silicon nitride could be used in the interconnect structure 200. Also, the particular sizes and shapes of the various components in the interconnect structure 200 are for illustration only. The components in the interconnect structure 200 could have any other suitable size or shape. In addition, the protection layer 210 for the interconnect structure 200b has been described as being formed using carbon nanotubes (CNTs) 214. However, any other nano-wire fillings or other nano-structures (whether metallic or non-metallic) could be used instead of or in addition to the carbon nanotubes (CNTs) 214.

Figure 6:
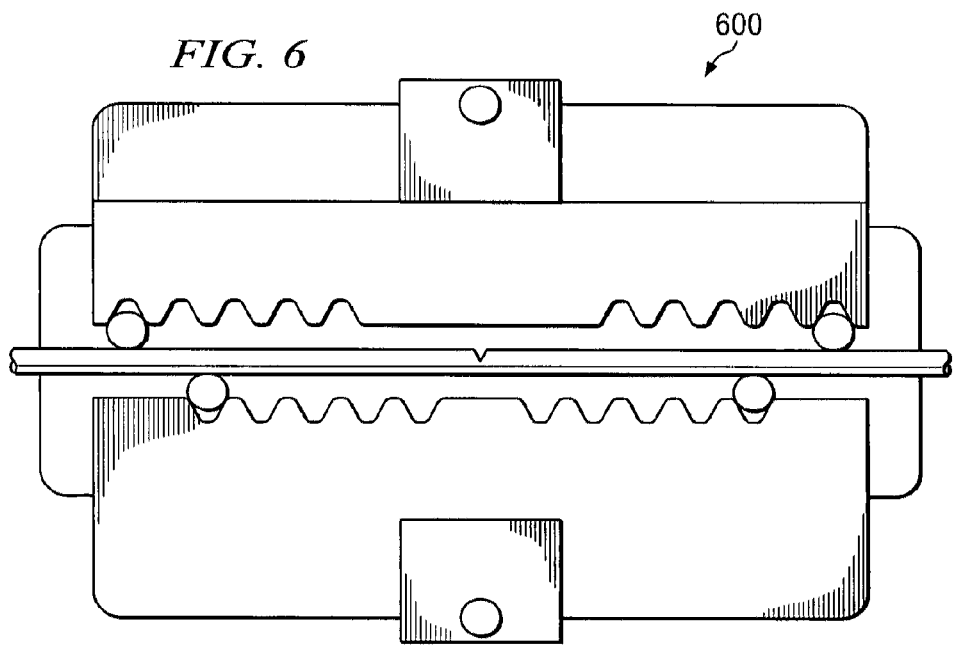
FIG. 6 illustrates an example Four-Point Bend test structure according to one embodiment of the present disclosure.
Figure 7:
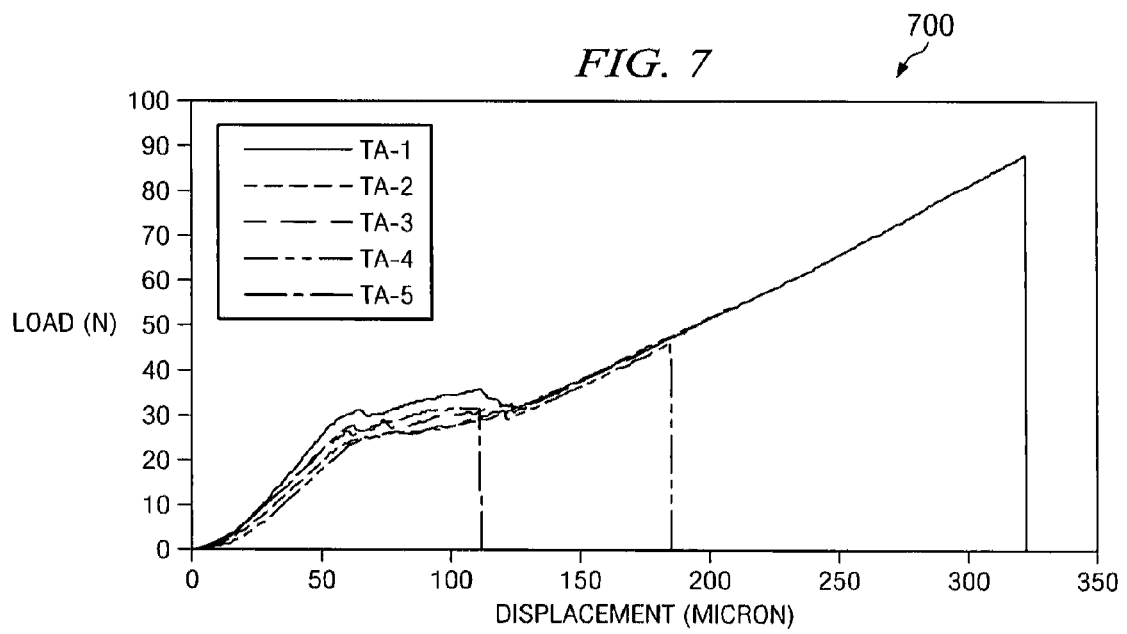
FIG. 7 illustrates example theoretical results associated with the Four-Point Bend test structure according to one embodiment of the present disclosure.

Interfacial adhesion energy of the copper and low-K material interfaces (reinforced by the protection layer 210) may be studied using a Four-Point Bend test structure 600 (shown in FIG. 6) or using nano-scratch/nano-indentation tests. Theoretical results 700 using the Four-Point Bend test structure 600 are shown in FIG. 7. In addition, a finite element method may be used to model the interconnect structure 200.

Figure 8:
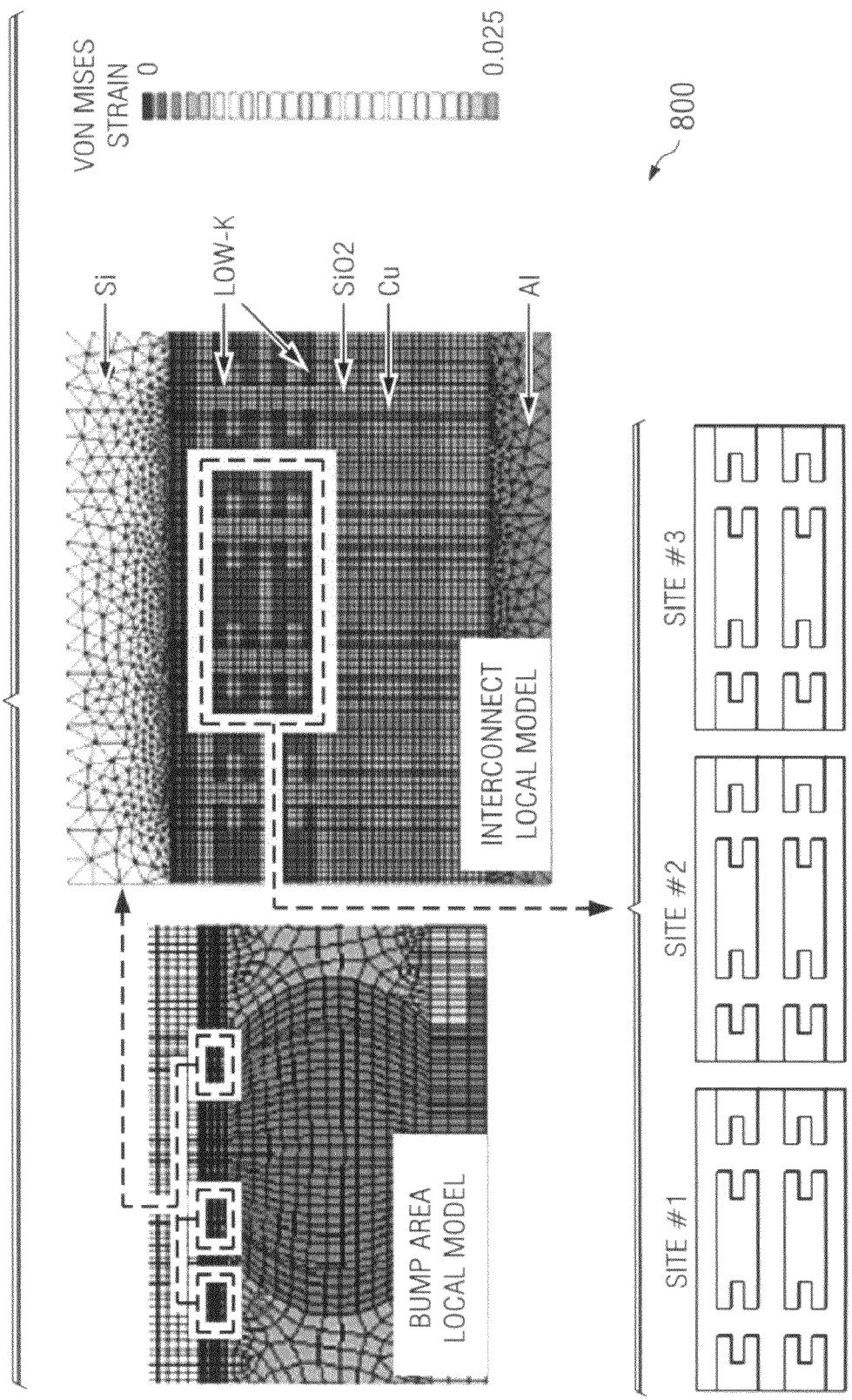
FIG. 8 illustrates an example modeling of a flip chip ball grid array (FCBGA) to quantify a cohesive crack phenomenon according to one embodiment of the present disclosure.

FIG. 8 illustrates the modeling 800 of a flip chip ball grid array (FCBGA) to quantify a cohesive crack phenomenon, allowing the effective strain contours to be compared. Sites #2 and #3 (the two sites located underneath the bump corners) may be the most critical ones. Moreover, with the considered patterning, these results highlight that the most strained layers may be located at the extreme inter-metal dielectric (IMD) layers (IMD1 and IMD4). As a result, the most likely areas for a cohesive crack initiation may be found to be the top and bottom low-K dielectric layers just below the two bump corners. The use of the interconnect structure 200 may help to avoid these types of cohesive cracks.

The interconnect structure 200 has good mechanical reliability with low-K materials due to protection layer 210. For example, the interconnect structure 200b has good mechanical reliability due to the carbon nanotubes (CNTs) 214 providing reinforcements in the protection layer 210. Based on the effects of carbon nanotube material composition, process parameters, and testing conditions on interfacial material reliability, different design guidelines can be used to optimize the interfacial material reliability by varying the structure and properties of the carbon nanotubes (CNTs) 214.

It may be advantageous to set forth definitions of certain words and phrases used throughout this patent document. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods have been set forth by implication and will be apparent to those skilled in the art. For example, some embodiments of this disclosure could have metal lines corresponding to the aforementioned metal lines 102 and 202, where the metal lines are formed of gold, silver, all-metal alloy, part-metal alloy, non-metallic conductive material, or any other suitable material or combination of materials.

As another example, some embodiments of this disclosure could have multiple protection layers corresponding to the aforementioned protection layer 210.

As yet another example, some embodiments of this disclosure could have aligned the carbon nanotubes (CNTs) 214 in orientations non-orthogonal to a layer corresponding to the aforementioned layer 208 (such as 85 degrees, 80 degrees, or 75 degrees). In some embodiments, the carbon nanotubes (CNTs) may be configured in symmetrical or asymmetrical patterns other than a honeycomb pattern (such as hexagonal, checkerboard, triangular, labyrinth, Archimedean spiral, logarithmic spiral, kagome lattice, or a combination of one or more patterns).

Accordingly, the above description of example embodiments does not define or constrain this disclosure. Other changes, substitutions, and alterations are also possible without departing from the spirit and scope of this disclosure, as defined by the following claims.

What is claimed is:

1. An interconnect structure comprising:
   a layer of low-K dielectric material;
   a metal line disposed directly on the layer of low-K dielectric material;
   a layer of silicon nitride disposed directly on the metal line, such that only the metal line is disposed between the layer of low-K dielectric material and the layer of silicon nitride; and
   a protection layer having a dielectric material and disposed on the layer of silicon nitride such that the protection layer resides along at least one outer edge of the interconnect structure, the protection layer further comprises carbon nanotubes (CNTs) uniformly dispersed in the dielectric material.

2. The structure of claim 1, wherein the protection layer comprises a plurality of layers of the dielectric material having the CNTs dispersed in at least one of the plurality of layers of the dielectric material.

3. The structure of claim 1, wherein the protection layer further comprises at least one of: a nano-wire filling, a metallic nano-structure, and a non-metallic nano-structure dispersed in the dielectric material.

4. The structure of claim 1, wherein the CNTs are configured in a vertical manner, a horizontal manner, a patterned manner, or a honeycomb pattern.

5. The structure of claim 1, wherein the CNTs are configured in a symmetrical pattern, an asymmetrical pattern, a triangular pattern, a labyrinth pattern, an Archimedean spiral pattern, a logarithmic spiral, or a kagome lattice.

6. The structure of claim 1, wherein the protection layer comprises multiple layers of aligned carbon nanotubes (CNTs).

7. The structure of claim 1, wherein the low-K dielectric material comprises at least one of: a silicon oxycarbide, an organic polymer, a fluorosilicate glass, and a black diamond.

8. The structure of claim 1, wherein the metal line comprises an all-metal alloy, a part-metal alloy, a non-metallic conductive material, a gold material, a silver material or a copper material.

9. For use in an integrated circuit, an interconnect structure comprising:
   a layer of low-K dielectric material;
   a metal line disposed directly on the layer of low-K dielectric material;
   a layer of silicon nitride disposed directly on the metal line, such that only the metal line is disposed between the layer of low-K dielectric material and the layer of silicon nitride; and
   a protection layer having dielectric material and carbon nanotubes (CNTs), the CNTs uniformly dispersed in the dielectric material, wherein the protection layer is disposed on the layer of silicon nitride such that the protection layer resides along at least one outer edge of the interconnect structure, and wherein the protection layer comprises multiple layers of aligned CNTs.

10. The structure of claim 9, wherein the CNTs are configured in a vertical manner, a horizontal manner, a patterned manner, or a honeycomb pattern.

11. The structure of claim 9, wherein the low-K dielectric material comprises at least one of: a silicon oxycarbide, an organic polymer, a fluorosilicate glass, and a black diamond.

12. An integrated circuit comprising an interconnect structure, the interconnect structure comprising:
   a layer of low-K dielectric material;
   a metal line disposed directly on the layer of low-K dielectric material;
   a layer of silicon nitride disposed directly on the metal line, such that only the metal line is disposed between the layer of low-K dielectric material and the layer of silicon nitride; and
   a protection layer having a dielectric material and disposed on the layer of silicon nitride, the protection layer further comprises a plurality of orientated nano-structures dispersed in the dielectric material, and wherein the protection layer comprises multiple layers of aligned carbon nanotubes (CNTs).

13. The integrated circuit of claim 12, wherein the CNTs are configured in a vertical manner, a horizontal manner, a patterned manner, or a honeycomb pattern.

14. The integrated circuit of claim 12, wherein the CNTs are configured in an asymmetrical pattern, a triangular pattern, a labyrinth pattern, an Archimedean spiral pattern, a logarithmic spiral, or a kagome lattice.

15. The integrated circuit of claim 12, wherein the CNTs are uniformly dispersed in the dielectric material.

16. The integrated circuit of claim 12, wherein the low-K dielectric material comprises at least one of: a silicon oxycarbide, an organic polymer, a fluorosilicate glass, and a black diamond.

17. The integrated circuit of claim 12, wherein the metal line comprises an all-metal alloy, a part-metal alloy, a non-metallic conductive material, a gold material, a silver material or a copper material.

* * * * *